(12) United States Patent
Forbes

(10) Patent No.: US 6,174,784 B1
(45) Date of Patent: *Jan. 16, 2001

(54) TECHNIQUE FOR PRODUCING SMALL ISLANDS OF SILICON ON INSULATOR

(75) Inventor: Leonard Forbes, Corvalis, OR (US)

(73) Assignee: Micron Technology, Inc., Boise, ID (US)

(*) Notice: Under 35 U.S.C. 154(b), the term of this patent shall be extended for 0 days.

This patent is subject to a terminal disclaimer.

(21) Appl. No.: 08/970,932

(22) Filed: Nov. 14, 1997

Related U.S. Application Data

(63) Continuation of application No. 08/706,230, filed on Sep. 4, 1996, now Pat. No. 5,691,230.

(51) Int. Cl.⁷ ................................................ H01L 21/76
(52) U.S. Cl. ...................... 438/405; 438/404; 438/410; 438/425
(58) Field of Search ................................ 438/404, 405, 438/410, 425

(56) References Cited

U.S. PATENT DOCUMENTS

| | | | |
|---|---|---|---|
| 3,407,479 | 10/1968 | Fordemwalt et al. | 29/577 |
| 3,457,123 | 7/1969 | Van Pul | 148/1.5 |
| 3,471,754 | 10/1969 | Hoshi et al. | 317/235 |
| 3,689,357 | 9/1972 | Jordan | 161/119 |
| 4,419,150 | 12/1983 | Soclof | 148/187 |
| 4,437,226 | 3/1984 | Soclof | 29/577 R |
| 4,561,932 | 12/1985 | Gris et al. | 156/643 |
| 4,580,331 | 4/1986 | Soclof | 29/580 |
| 4,604,162 | 8/1986 | Sobczak | 156/657 |
| 4,625,391 | 12/1986 | Sasaki | 29/589 |
| 4,685,198 | * 8/1987 | Kawakita et al. | 148/DIG. 50 |
| 4,755,481 | 7/1988 | Faraone | 437/62 |

(List continued on next page.)

OTHER PUBLICATIONS

Abe, et al., "Silicon Wafer–Bonding Process Technology for SOI Structures", Conference on Solid State Devices and Materials, Sponsored by The Japan Society of Applied Physics, 853–856, (1990).

Auberton–Herve, A.J., "SOI: Materials to Systems", Digest of the International Electron Device Meeting, San Francisco, 3–10, (Dec. 1996).

Cartagena, et al., "Bonded Etchback Silicon on Sapphire Bipolar Junction Transistors", In: The Electrochemical Society Interface, 2(1), Program and Abstracts: 183rd Meeting of the Electrochemical Society Pennington, NJ, 2 pages, (1993).

Eaton, W.P., et al., "Wafer Bonding by Low Temperature Melting Glass", Proceedings of the First International Symposium on Semiconductor Wafer Bonding, Gosele, U., et al., (eds.), Electrochemical Society, Pennington, NJ, 146–152, (1992).

(List continued on next page.)

Primary Examiner—Trung Dang
(74) Attorney, Agent, or Firm—Schwegman, Lundberg, Woessner & Kluth, P.A.

(57) ABSTRACT

Using sub-micron technology, silicon on insulator (SOI) rows and islands are formed in a silicon substrate. Trenches are directionally-etched in the silicon substrate, leaving rows of silicon between the trenches. Silicon nitride is then deposited over the trenches, extending partly down the sides of the trenches. An isotropic chemical etch is then used to partially undercut narrow rows of silicon in the substrate. A subsequent oxidation step fully undercuts the rows of silicon, isolating the silicon rows from adjacent active areas. Devices, such as transistors for CMOS and DRAMs, are then formed in active areas, wherein the active areas are defined on the silicon rows by LOCal Oxidation of Silicon (LOCOS).

26 Claims, 3 Drawing Sheets

U.S. PATENT DOCUMENTS

| | | | |
|---|---|---|---|
| 4,763,183 | 8/1988 | Ng et al. | 357/23.7 |
| 4,845,048 | 7/1989 | Tamaki et al. | 437/62 |
| 5,001,526 | 3/1991 | Gotou | 357/23.6 |
| 5,177,028 | 1/1993 | Manning | 437/41 |
| 5,234,535 | 8/1993 | Beyer et al. | 156/630 |
| 5,391,911 | 2/1995 | Beyer et al. | 254/522 |
| 5,426,070 | 6/1995 | Shaw et al. | 437/203 |
| 5,441,591 | 8/1995 | Imthurn et al. | 156/153 |
| 5,466,625 | 11/1995 | Hsieh et al. | 437/52 |
| 5,483,487 | 1/1996 | Sung-Mu | 365/185.33 |
| 5,492,853 | 2/1996 | Jeng et al. | 437/60 |
| 5,497,017 | 3/1996 | Gonzales | 257/306 |
| 5,528,062 | 6/1996 | Hsieh et al. | 257/298 |
| 5,640,342 | 6/1997 | Gonzalez | 365/156 |
| 5,691,230 * | 11/1997 | Forbes . | |
| 5,710,057 | 1/1998 | Kenney | 437/62 |
| 5,773,152 | 6/1998 | Okonogi | 428/446 |

OTHER PUBLICATIONS

Harendt, et al., "Silicon on Insulator Material by Wafer Bonding", *Journal of Electronic Materials,* 20(3), 267–77, (Mar. 1991).

Horiuchi, M., et al., "A Mechanism of Silicon Wafer Bonding", Proceedings of the First International Symposium on Semiconductor Wafer Bonding, 48–62, (1992).

Imthurn, et al., "Bonded Silicon–on–Sapphire Wafers and Devices", *Journal of Applied Physics,* 72(6), 2526–7, (Sep. 1992).

Lasky, J.B., "Wafer Bonding for Silicon–on–Insulator Technologies", *Applied Physics Letters,* 48(1), 78–80, (Jan. 6, 1986).

Lee, B.H., et al., "Novel Pattern Transfer Process for Bonded SOI Giga–bit DRAMs", IEEE International SOI Conference, Piscataway, NJ, 114–115, (1996).

Lu, D., et al., "Bonding Silicon Wafers by Use of Electrostatic Fields Followed by Rapid Thermal Heating", Materials Letters, 4(11), 461–464, (Oct. 1986).

Mumola, P.B., et al., "Recent Advances in Thinning of Bonded SOI Wafers by Plasma Assisted Chemical Etching", *Electrochemical Society Proceedings,* 95–7, 28–32, (1995).

Nakamura, et al., "Giga–bit DRAM Cells with Low Capacitance and Low Resistance Bit–Lines on Buried MOSFET's and Capacitors by Using Bonded SOI Technology–Reversed–Stacked—Capacitor (RSTC) Cell—", Technical Digest—International Electron Devices Meeting, 889–892, (1995).

Quenzer, H.J. et al., "Low Temperature Silicon Wafer Bonding for Micromechanical Applications", Proceedings of the First International Symposium on Semiconductor Wafer Bonding, Gosele, U., et al., (eds.), Electrochemical Society, Pennington, NJ, 92–100, (1992).

Huang, W.L., et al., "TFSOI Complementary BiCMOS Technology for Low Power Applications", IEEE Transactions on Electron Devices, 42, 506–512, (Mar. 1995).

Kuge, S., et al., "SOI–DRAM Circuit Technologies for Low Power High Speed Multigiga Scale Memories", IEEE Journal of Solid–State Circuits, 31, 586–591, (Apr. 1996).

* cited by examiner

TECHNIQUE FOR PRODUCING SMALL ISLANDS OF SILICON ON INSULATOR

This application is a continuation of U.S. patent application Ser. No. 08/706,230, filed Sep. 4, 1996 now U.S. Pat. No. 5,691,230.

FIELD OF THE INVENTION

The present invention relates to methods and apparatus for isolating semiconductor devices with silicon on insulator technology, and in particular, for forming isolated silicon islands using sub-micron technology.

BACKGROUND OF THE INVENTION

The advantages of silicon on insulator (SOI) technology for complementary metal-oxide-semiconductor (CMOS) integrated circuits (ICs) are well documented. In general, undesired p-n junction capacitance between a source/drain and a substrate is reduced by approximately twenty-five-percent when using SOI technology. Furthermore, active current consumption is less and device access time is equivalent to that of similar devices formed on bulk-silicon substrates. Other advantages of SOI technology include suppression of the short channel effect, suppression of the body-effect, high punch-through immunity, and freedom from latch-up and soft errors. As the demand increases for battery-operated equipment, SOI technology is becoming increasingly more popular due to its low power requirements and high speeds.

There are many different techniques for isolating devices in ICs. A technique is selected according to its different attributes, such as: minimum isolation spacing, surface planarity, process complexity, and density of defects generated during fabrication.

SIMOX (Separation by IMplanted OXygen) technology is one method for forming SOI structures. SIMOX entails implanting a high dose of oxygen ions at a sufficiently deep level within a silicon substrate. A subsequent anneal step forms a buried oxide layer in the substrate. After the anneal step, an additional layer of epitaxial silicon is usually deposited to obtain a sufficiently thick silicon layer on which to form a device. Disadvantages of using SIMOX include its high expense and yield loss, which undesirably decreases achievable chip density.

Another technique for forming an isolation layer in a substrate is by the wafer bonding method. Using this technique, two oxidized silicon wafers are fused together through a high-temperature furnace step. However, this technique increases the substrate thickness, which is often a critical dimension. Furthermore, wafer bonding techniques are often plagued by low production yield due to particles/voids, which prevent adequate bonding between the two wafers in such areas.

Another technique used for forming an isolation layer in a substrate is by forming silicon islands through a series of etch and oxidation steps. For example, U.S. Pat. No. 4,604,162 (hereinafter the '162 patent) uses a series of a pad oxide layer, a silicon nitride layer, and a silicon dioxide layer, which is photolithographically masked and anisotropically etched to define silicon islands capped with a silicon nitride layer. Then, a second anisotropic etch (such as a reactive ion etch (RIE)) removes further substrate material between the silicon islands. The depth of the second anisotropic etch is proportional to the width of the silicon islands. A subsequent oxidation step forms silicon dioxide, undercutting the silicon islands and isolating each of them from surrounding regions. However, this technique has not been used commercially because it is too costly and consumes too much time to oxidize an area having an effective width as great as that of the feature size. Another disadvantage of this technique is that the resulting isolated silicon structure has excess mechanical stress and crystal damage at each of its corners, due to oxidation around the entirety of each individual island, which is necessary for its complete isolation. Furthermore, the method described in the patent application requires an additional planarization step, which adds complexity to the fabrication process.

There is a need for an effective isolation technique for sub-micron semi-conductor technology that is efficient and simple. A primary concern in the fabrication of ICs is simplicity and minimization of process steps. There is a need for an isolation technique that is inexpensive and compatible with large volume CMOS manufacturing technology. Furthermore, an isolation technique, which allows fabrication of highly dense ICs without increasing the dimensions of the IC is needed.

SUMMARY OF THE INVENTION

Silicon on insulator (SOI) rows and islands are formed for subsequent sub-micron device formation. For example, complementary metal-oxide-semiconductor (CMOS) transistors are later formed on such SOI rows, isolated from each other using standard techniques, such as LOCal Oxidation of Silicon (LOCOS). To form the rows, trenches are directionally-etched in a silicon substrate, leaving rows of silicon between the trenches.

Silicon nitride is then deposited over the trenches, extending partly down the sides of the trenches. An isotropic chemical etch is then used to partially undercut narrow rows of silicon in the substrate. It is important to use an isotropic etch for this step to compensate for the volume of oxide to be formed. In general, the volume of oxide formed is approximately twice that of the silicon consumed. Furthermore, an isotropic etch is necessary to advantageously minimize the subsequent oxidation time needed to fully undercut the silicon rows. The subsequent oxidation step fully undercuts the rows of silicon, isolating the silicon rows from adjacent active areas.

One advantage of this invention is that by using narrow, sub-micron rows of silicon and appropriately designed process conditions, generally planar structures are formed in an integrated circuit (IC). The larger volume of oxide fills the trenches between the rows. This avoids complex and expensive planarization techniques, such as employed in older micron dimension technologies. Furthermore, such oxidation minimizes mechanical stress and crystal damage in resulting structures, when used to finish undercutting rows, as compared to undercutting individual silicon islands.

This invention enables formation of sub-micron devices, such as CMOS transistors, having a high chip density, without increasing the dimensions of the IC. This method yields isolated active regions, having a high degree of regularity and yield, formed in an inexpensive manner. This method is compatible with CMOS IC manufacturing technology due to its simplicity and minimal number of process steps. Regular array structures, such as dynamic random access memories (DRAMs) particularly benefit from this invention, separated on the silicon rows using LOCOS technology.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

Figure 1A:
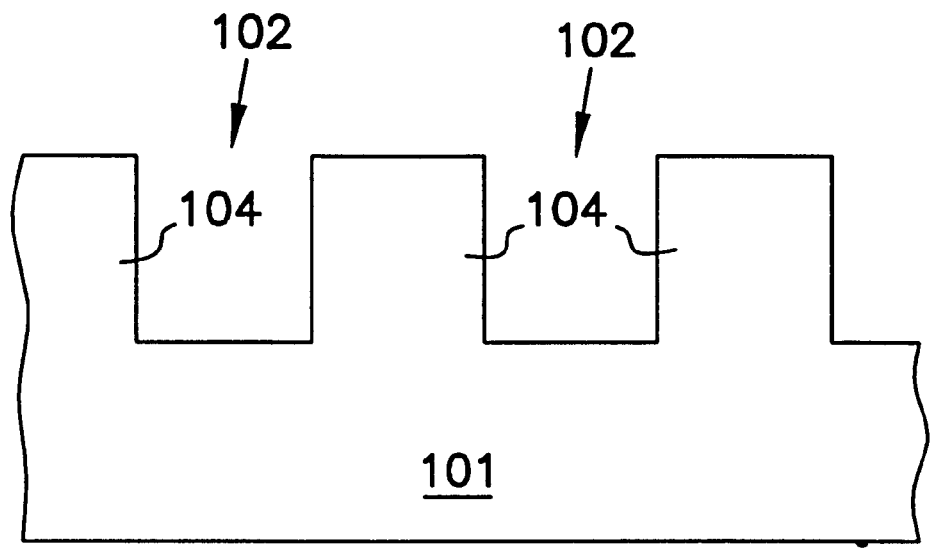
FIGS. 1A to 1D are cross-sectional representations of a method for forming isolated silicon rows.

As shown in FIG. 1A, a silicon substrate 101 is directionally-etched to form trenches 102, leaving rows 104 of silicon protruding from the substrate 101. The silicon rows 104 have widths of one micron or less. The trench 102 depth and width are approximately equal to the width of the silicon rows 104. The direction of the etch varies with the crystal orientation of the substrate 101. In one embodiment, the etch direction is orthogonal to the plane of the substrate 101. For complementary metal-oxide-semiconductor (CMOS) devices, substrates 101 having a {100} crystallographic orientation are commonly used due to the ability to achieve small surface state densities on such substrates. Therefore, the direction of the etch is preferably in the <100> direction. To form the trenches, the substrate 101 is oxidized at a temperature of approximately 900 to 1,100 degrees Celsius, covered with silicon nitride ($Si_3N_4$), masked and etched to form exposed oxide regions using standard techniques. Then, the exposed oxide regions are etched away with a directional etchant, preferably a reactive ion etch (RIE), forming trenches 102 in the substrate 101.

Figure 1B:
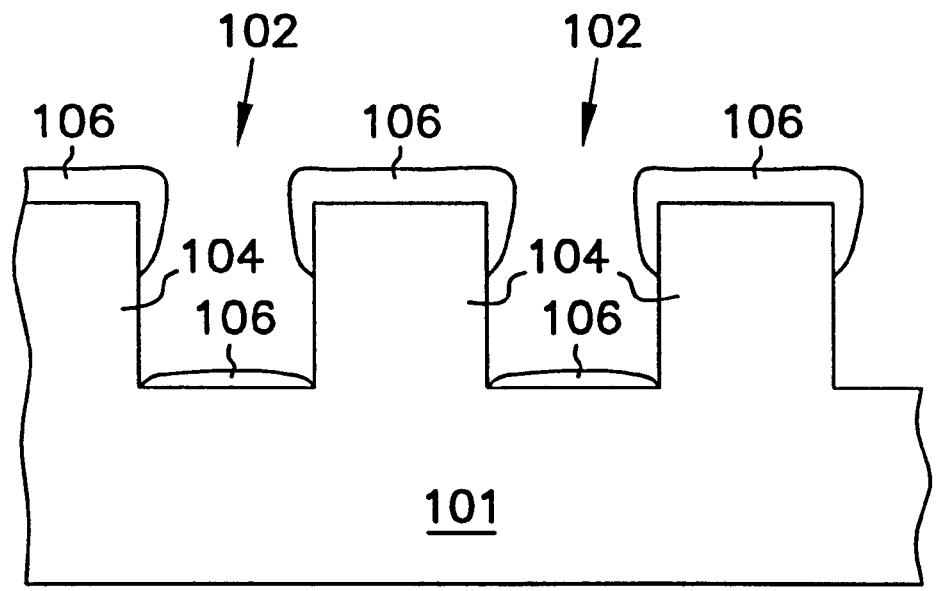

Next, as shown in FIG. 1B, a $Si_3N_4$ cap 106 is formed on the silicon rows 104. The $Si_3N_4$ 106 is deposited over the structure, using techniques well known in the art, such as chemical vapor deposition (CVD). $Si_3N_4$ 106 forms on the tops of the silicon rows 104 and partly down the sides of the trenches 102. Material overhang at the top of the trench 102 prevents $Si_3N_4$ 106 from covering the lower sides of the trenches 102. However, some $Si_3N_4$ 106 is deposited onto the bottom of the trenches 102.

Figure 1C:
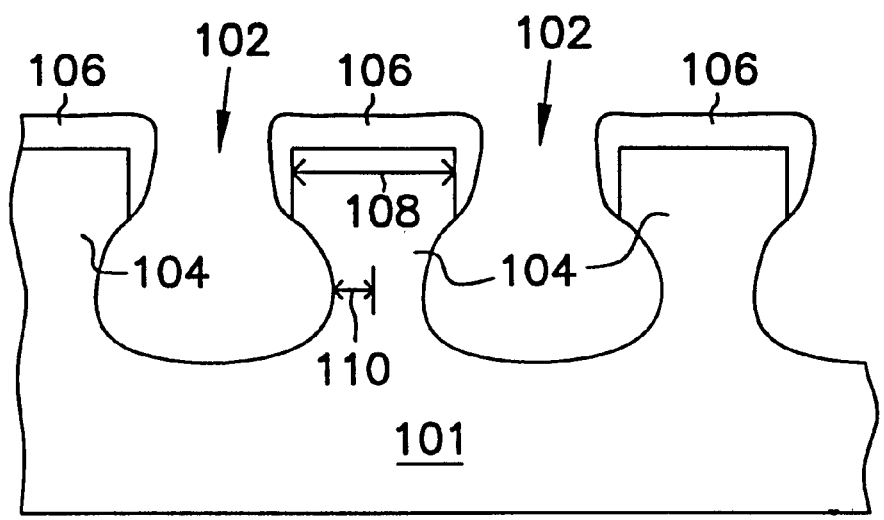

A photoresist mask is used to cover the silicon rows 104 and an etch is then used to remove residual $Si_3N_4$ 106 on the bottom of the trenches 102 and then an isotropic chemical etch is used to partially undercut the rows 104 of silicon, as shown in FIG. 1C. A standard chemical etch using hydrofluoric acid (HF) or a commercial etchant sold under the trade name CP4 (a mixture of approximately 1 part (46% HF):1 part ($CH_3COOH$):3 parts ($HNO_3$)) is used for the isotropic etchant. It is important to use an isotropic etch for this step to compensate for the volume of oxide to be formed in the next step. In general, the volume of oxide formed is approximately twice that of the silicon 101 consumed. Partially undercutting the silicon rows 104, reduces the effective width of the rows 104 to a distance 110 small enough that a relatively short, simple oxidation can fully undercut the silicon rows 104. Fully undercutting the rows 104 of silicon is possible because the width 108 of the rows 104 is one micron or less.

Figure 1D:
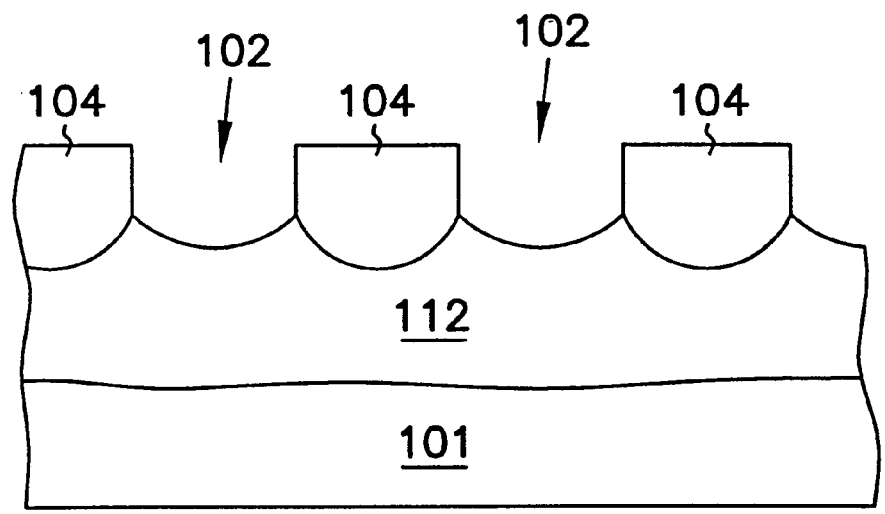

The substrate 101 is then oxidized using a standard silicon processing furnace at a temperature of approximately 900 to 1,100 degrees Celsius, as shown in FIG. 1D. A wet, oxidizing ambient is used in the furnace chamber to oxidize the exposed silicon regions on the lower part of the trenches 102 in a parallel direction to the surface of the substrate 101. The substrate 101 is oxidized for a time period, such that oxide 112 fully undercuts the bottom of the silicon rows 104, leaving isolated silicon rows 104. By using narrow, sub-micron rows 104 of silicon and appropriately designed process conditions, generally planar structures are formed. The larger volume of oxide fills the trenches 102 between the rows 104. This avoids the need for complex and expensive planarization techniques, such as employed in older micron dimension technologies. The time period for oxidation depends on the width 108 of the rows 104 and the effective width 110 after the partial undercut step. As the desired size of the silicon rows 104 decreases, so does the required oxidation time. For example, for sub-micron technology, oxidation time is approximately 3 to 4 hours. For sub-0.25 micron technology, oxidation time is approximately 1 hour.

Figure 1E:
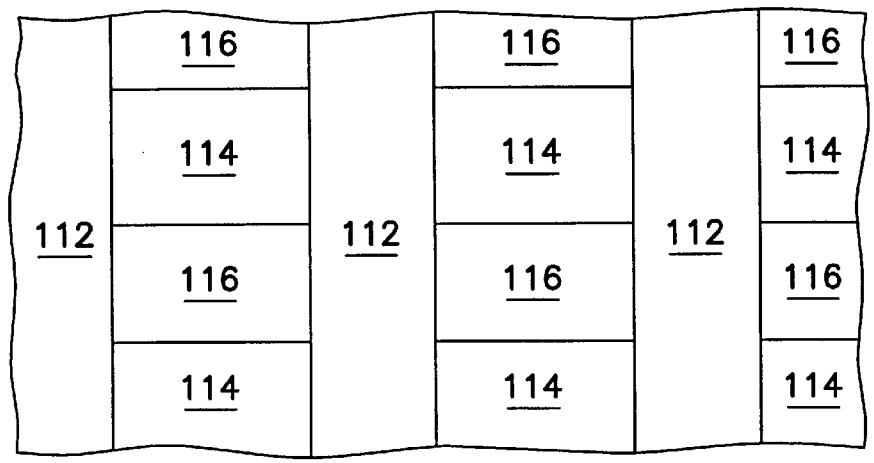
FIG. 1E is a plan view of isolated silicon islands formed on the isolated silicon rows shown in FIG. 1D.

Active areas 114 are then defined on the individual silicon rows 104, using a standard process, such as LOCal Oxidation of Silicon (LOCOS), as shown in FIG. 1E, to form oxide 116 between the active areas 114. Depending on the width of the silicon rows 104, the area of these active areas 114 is approximately one square micron or less for sub-micron technology and approximately 0.0625 square microns or less for sub-0.25 micron technology. The resulting isolated active areas 114 are not subjected to as much mechanical stress and crystal damage as are active areas formed by prior art techniques of oxidizing to undercut each individual active area, which are excessively stressed and damaged at each corner of the active area.

Figure 1F:
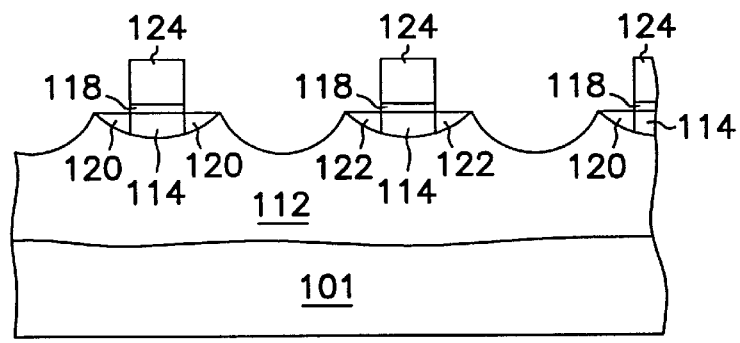
FIG. 1F is a cross-sectional representation of NMOS and PMOS transistors formed on the isolated silicon islands shown in FIG. 1E.
Figure 1G:
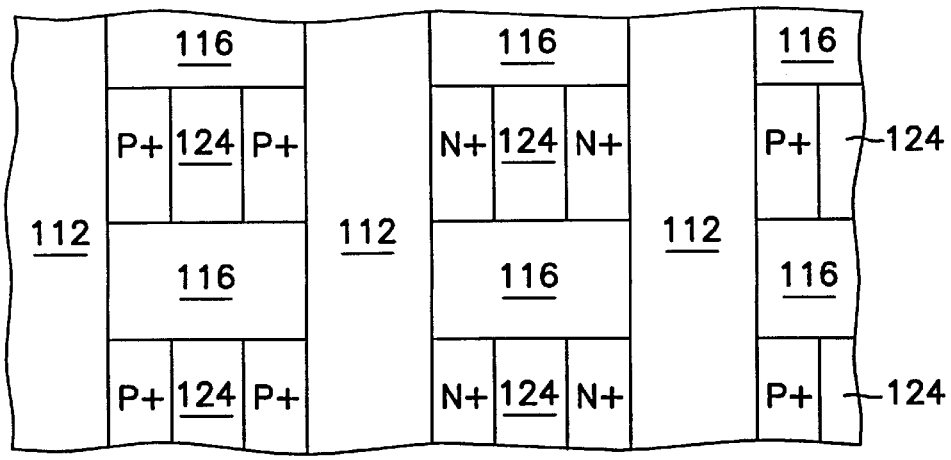
FIG. 1G is a plan view of the NMOS and PMOS transistors shown in FIG. 1F.

Devices are then formed on the resulting silicon islands 114, as shown in FIGS. 1F and 1G, according to methods well known in the art. For example, when forming CMOS transistors, a gate oxide layer 118, source/drain regions 120, 122, and a gate 124 are formed for each transistor on an individual silicon island 114. For PMOS transistors, source/drain regions 120 are doped to form (p+) regions. For NMOS transistors, source/drain regions 122 are doped to form (n+) regions. Further standard process techniques are then used to connect the devices to form circuits, such as dynamic random access memory (DRAM) devices.

The process described above is a low cost, simple method for forming sub-micron SOI devices. The method is compatible with existing large volume manufacturing conditions. Resulting devices are able to formed on semiconductor chips in a highly dense, arrayed manner. Thus, the invention enables formation of very high density and very high performance CMOS integrated circuits, DRAMs, as well as other integrated circuits.

It should be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for manufacturing a silicon on insulator substrate, comprising:
    etching parallel trench regions in a substrate to form a plurality of trenches between a plurality of protruding silicon structures;
    depositing a layer of an etch-resistant material on the silicon structures, the material extending partway down the sides and covering the bottom of the trenches,
    patterning the protruding silicon structures with a mask and etching the unmasked areas to remove the etch resistant material from the bottom of the trenches;
    partially undercutting the plurality of protruding silicon structures; and
    forming oxide under the remaining portions of the plurality of protruding silicon structures.

2. The method of claim 1, where the plurality of protruding silicon structures are rows.

3. The method of claim 2, where the plurality of protruding silicon structures protrude from the trenches.

4. The method of claim 1, where the trenches are formed by etching the insulator substrate.

5. The method of claim 4, where the etch is directional.

6. The method of claim 1, where the plurality of protruding silicon structures are partially undercut by etching.

7. The method of claim 6, where the etch is isotropic.

8. The method of claim 6, where the plurality of protruding silicon structures are undercut to the extent required to approximately compensate for the volume of the oxide formed under the plurality of protruding silicon structures.

9. The method of claim 1, where the oxide is formed by oxidizing a remaining thickness of the plurality of protruding silicon structures below the layer of etch resistant material.

10. The method of claim 9, where the oxide fully undercuts the plurality of protruding silicon structures.

11. The method of claim 1, where the oxide is formed by oxidizing the trenches.

12. The method of claim 11, where the oxide partially fills in the trenches.

13. A method for manufacturing a silicon on insulator substrate, comprising the steps of:
    etching a silicon substrate to form trenches between a plurality of silicon structures;
    depositing etch-resistant material on the silicon structures extending partway down and across the bottom of the trenches;
    removing the etch resistant material from the bottom of the trenches;
    etching the trenches so as to partially undercut the silicon structures; and
    oxidizing the substrate to the extent required to form an insulating layer fully under the silicon structures.

14. The method of claim 13, where the silicon structures are rows.

15. The method of claim 13, where the etch-resistant cap is silicon nitride.

16. The method of claim 13, where the etch for forming the trenches is a directional etch.

17. The method of claim 13, where the etch for partially undercutting the structures is an isotropic etch.

18. The method of claim 13, where the oxide fully undercuts the silicon structures.

19. The method of claim 13, where the oxide partially fills in the trenches.

20. A method for manufacturing a silicon on insulator substrate, comprising:
    forming a plurality of trenches between a plurality of silicon rows to expose protruding silicon structures
    forming an etch-resistant cap on the silicon structures, the etch resistant cap extending partway down the sides and etch resistant material of the cap also extending across the bottom of the trenches;
    removing the etch resistant material from the bottom of the trenches;
    partially undercutting the plurality of protruding silicon structures;
    forming oxide under remaining portions of the plurality of protruding silicon structures; and
    separating the plurality of protruding silicon structures into a plurality of active areas.

21. The method of claim 20, where the active areas are insulated from each other.

22. The method of claim 20, where the active areas are separated by local oxidation of silicon.

23. The method of claim 20, further comprising forming transistors on at least some of the active areas.

24. The method of claim 23, where the transistors have source and drain regions.

25. The method of claim 24, further comprising forming a gate oxide layer for the transistors.

26. The method of claim 25, further comprising forming a gate layer for the transistors on the gate oxide layer.

* * * * *